United States Patent [19]

Belkind et al.

[11] Patent Number: 4,769,291

[45] Date of Patent: Sep. 6, 1988

[54] TRANSPARENT COATINGS BY REACTIVE SPUTTERING

[75] Inventors: Abraham I. Belkind, North Plainfield, N.J.; Erik Bjornard, Concord, Calif.; James J. Hofmann, Hackettstown, N.J.; Donald V. Jacobson, Concord; Steven J. Nadel, Oakland, both of Calif.

[73] Assignee: The BOC Group, Inc., Montvale, N.J.

[21] Appl. No.: 10,023

[22] Filed: Feb. 2, 1987

[51] Int. Cl.$^4$ .................. C23C 14/10; C23C 14/18
[52] U.S. Cl. ..................... 428/630; 428/632; 428/641; 428/650; 428/658; 428/673; 428/34; 204/192.23; 204/192.26; 204/192.29
[58] Field of Search ............. 428/627, 630, 632, 641, 428/650, 658, 673, 34; 204/192.15, 192.22, 192.23, 192.26, 192.27, 192.28, 192.29

[56] References Cited

U.S. PATENT DOCUMENTS 4,125,446 11/1978 Hartsouch et al. ............ 204/192.29
4,610,771 9/1986 Gillery ........................... 204/192.1

OTHER PUBLICATIONS

J. C. Williams et al., "Preparation of Thin Mullite Films", J. Am. Ceram. Soc., vol. 46, pp. 161–167 (1963).
R. S. Nowicki, "Influence of Residual Gases on the Prop. of dc Magnetron Sputtered Al–Si", J. Vac. Sci. Technol., 17(1), pp. 384–387 (1980).

Primary Examiner—Melvyn J. Andrews
Assistant Examiner—George Wyszomierski
Attorney, Agent, or Firm—David A. Draegert; Larry R. Cassett

[57] ABSTRACT

A method for depositing a protective coating by cathode sputtering of an alloy of aluminum and silicon in a reactive gas is disclosed. The sputtering target contains sufficient silicon to produce an amorphous coating; 6 to 18 percent silicon is preferred. Targets of approximately 88% aluminum and 12% silicon are especially preferred. Oxygen, nitrogen, compounds of oxygen and compounds of nitrogen are preferred reactive gases. A range of combinations of oxygen and nitrogen are particularly preferred. The method provides durable transparent coatings which may be used as an overcoating for a metal or dielectric coating to provide increased resistance to abrasion and corrosion. In particular, the protected coating may be a metal, dielectric or dielectric-metal-dielectric coating as used in double-glazed window units for buildings or vehicles.

25 Claims, 1 Drawing Sheet

TRANSPARENT COATINGS BY REACTIVE SPUTTERING

BACKGROUND OF THE INVENTION

The invention relates to the cathode sputtering of metals in the presence of a reactive gas to form a durable, transparent coating on a substrate.

Windows of modern buildings and vehicles are provided with coatings having particular optical properties. Thin metal films are deposited on glass or plastic to increase the reflectance of solar radiation. Even more energy efficient windows include a multilayer dielectric-metal-dielectric coating having a high visible transmittance combined with high reflectivity and low emissivity in the infrared wavelength range of the electromagnetic spectrum. The index of refraction of the dielectric layer is preferably 2.0 or greater in order to minimize the visible reflectance and enhance the visible transmittance of the window. Such multilayer coatings are frequently deposited by sputtering metal targets in an atmosphere of inert gas to deposit a metal layer and in an atmosphere containing a reactive gas to deposit the dielectric layers. Such sputtered coatings are described in U.S. Pat. No. 4,610,771 to Gillery.

One such dielectric-metal-dielectric coating comprises successive layers of zinc oxide, silver, zinc and zinc oxide deposited on a float-glass substrate. Silver is preferred because of its high infrared reflectance, but the metal layer may also be gold, copper, or another good electrical conductor. When silver is used, it is usually covered with a very thin layer of zinc, tin, titanium, aluminum or other metal to protect the silver from corrosion. Zinc oxide is a preferred dielectric because it has a refractive index of 2.0 and it can be deposited by reactive sputtering at rates which are relatively high for oxides. Various other materials, such as oxides of bismuth, titanium, tin and indium, and nitrides of aluminum are also used as dielectric layers.

Usually the coated glass is sealed as part of a double-glazed window unit in which the coating lies on an inside surface where the coating is protected by glass from abrasion and environmental materials which could cause corrosion and degrade the optical properties of the coating. Abrasion and corrosion are problems even while handling of the coated glass before and during the fabrication process.

There is a recognized need for a harder and more corrosion resistant dielectric material to provide a protective overcoat for metal or dielectric coatings or to replace some or all of one or both of the dielectric layers in a dielectric-metal-dielectric coating. The present invention relates to the use of reactively sputtered aluminum-silicon alloys for these and other purposes.

Aluminum-silicon alloys have previously been sputtered in a reactive gas.

In a paper "Preparation of Thin Mullite Films", J. Am. Ceram Soc., Vol. 46, pp. 161-167 (1963), J. C. Williams et al, disclosed deposition of mixed $Al_2O_3$/$SiO_2$ films by sputtering in oxygen of aluminum-silicon alloy targets having 20, 28 and 40 wt. % silicon.

In a paper, "Influence of Residual Gases on the Properties of DC Magnetron-Sputtered Aluminum-Silicon", J. Vac. Sci. Technol., Vol. 17, pp. 384-387 (1980), R. S. Nowicki disclosed metal films deposited by sputtering a target of aluminum-1.5% silicon in gas of argon-1% oxygen.

SUMMARY OF THE INVENTION

The invention relates to a coating deposited by sputtering an aluminum-silicon alloy in a reactive gas to deposit a transparent amorphous (glassy) coating. Such a coating is particularly useful as a protective overcoating for a dielectric-metal-dielectric or other coating on a transparent glass or plastic base.

The lower level of silicon which must be present in the alloy to obtain an amorphous coating is not precisely known. It is believed that aluminum-2% silicon forms oxide coatings which are primarily crystalline or microcrystalline and which are therefore more permeable and less suitable as corrosion barrier layers. The useful upper limit of silicon is also not precisely known. The electrical conductivity of pure silicon is so low that it is unsuitable for sputtering with direct current. As little as 0.2% aluminum in silicon provides adequate conductivity. Inclusion of about 5% aluminum in silicon would significantly lower the cost of a sputtering target and a target having about 10% aluminum would likely have a significantly higher deposition rate. Aluminum-silicon alloys which can be fabricated easily into dense targets suitable for high rate sputtering are preferred. Targets formed by vacuum casting of an alloy of approximately 70% aluminum and 30% silicon were so porous that arcing during reactive sputtering was a severe problem. The phase diagram of aluminum-silicon has a eutectic at 88.3 percent aluminum and 11.7 percent silicon. Compositions having approximately 88 percent aluminum and 12 percent silicon with incidental impurities are especially preferred because dense, easily sputtered targets can be prepared readily and inexpensively by conventional methods. Alloys containing significant amounts of metal in addition to aluminum and silicon would have eutectics at other concentrations. Taking these factors into consideration, the preferred range for the aluminum-silicon alloys according to the invention is 6 to 18 percent by weight silicon. For binary alloys, the corresponding range is 82 to 94% aluminum. A range of 10 to 14 percent silicon is more preferred.

The sputtering gas is preferably a mixture of an inert gas, preferably argon, and a reactive gas. Oxygen, nitrogen, mixtures of oxygen and nitrogen, and gaseous compounds of oxygen and nitrogen, such as nitrous oxide, are preferred but other reactive gases are possible. Use of a mixture of argon and oxygen produces films having an index of refraction of approximately 1.6 and a normalized deposition rate (as defined below) of 150 A $mm^2$/J. A mixture of argon and nitrogen produces films having an index of 2.2 and a normalized deposition rate of 500 A $mm^2$/J. A mixture of argon, oxygen and nitrogen produces films having intermediate values of the refractive index and deposition rate.

The film deposited according to the invention contains reaction products of aluminum and silicon with reactive components from the reactive gas. When the sputtering gas contains oxygen, the deposited coating contains a mixture of aluminum and silicon oxides. When the sputtering gas contains nitrogen, the coating contains a mixture of aluminum and silicon nitrides. All of these four compounds are relatively hard. These reaction products form an amorphous film which is a better barrier against corrosion than zinc oxide and other materials which form polycrystalline films.

The method and coated articles according to the invention provide durable, transparent coatings which can be deposited at relatively high rates utilizing easily sputtered targets having a reasonable cost. The thickness and sometimes the index of refraction of the coatings can be adjusted to obtain tinted or essentially colorless films, as desired. The hardness and corrosion resistance makes the coating less susceptible to environmental conditions and handling while a coated glass is made into a double-glazed window unit.

DESCRIPTION OF THE PREFERRED EMBODIMENTS

Figure 1:
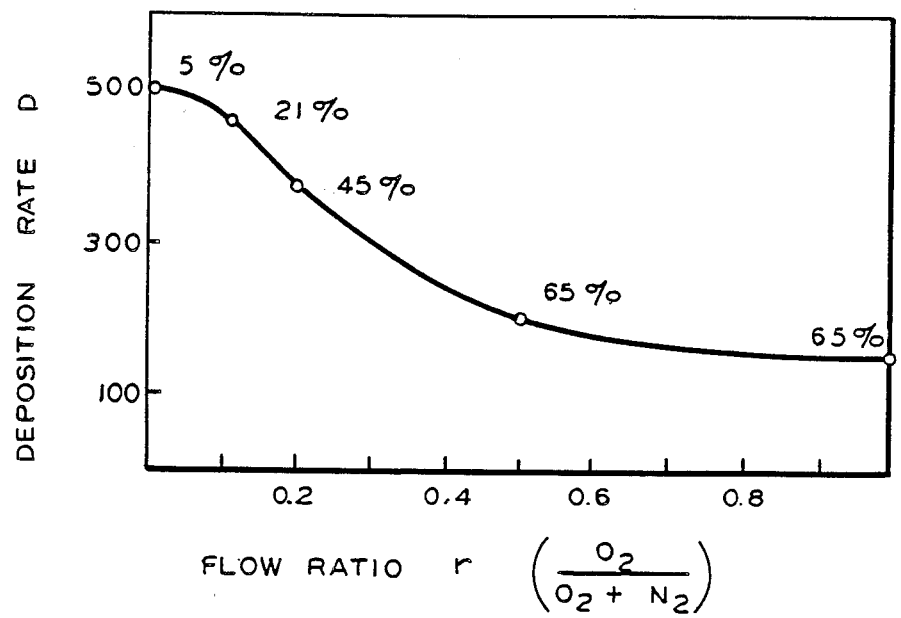
FIG. 1 is a graph showing the normalized deposition rate D in (A mm$^2$/J) as a function of the ratio r of $O_2$ flow to the total flow of $O_2$ and $N_2$ for coatings deposited by sputtering a target of 88% aluminum and 12% silicon in a mixture of argon, oxygen and nitrogen according to the invention.

The coatings are prepared with conventional sputtering equipment. One or more sputtering sources are placed in a chamber which can be sealed and evacuated by conventional vacuum pumps. If metal and dielectric coatings are to be deposited, the sources may be separated by gates or isolation regions which are separately evacuated to prevent cross-contamination of sputtering gases. The pressure and flow rate of the sputtering gases are also controlled by conventional devices. If a mixed gas is used, the various components are separately controlled. Each sputtering source is connected to an appropriate power source, preferably a direct current source having provision for automatically maintaining the voltage, current or power, as desired.

A first sample was deposited in a vacuum system comprising a load lock and a coating chamber fitted with one round and two rectangular planar magnetron sputtering sources of the type disclosed in U.S. Pat. No. 4,166,018 to Chapin. The round source had a silver target 6 inches in diameter. The two rectangular sources had 4×8 inch targets, one of zinc and the other of an aluminum-silicon alloy. The target was 73% aluminum and 27% silicon with incidental impurities and was prepared by the conventional steps of mixing appropriate amounts of metal powder; melting, casting and cooling in vacuum; and then machining to final size. 4×4 or 4×6 inch glass substrates were cleaned and then coated with 400 to 450 A (angstroms) of zinc oxide deposited by sputtering a zinc target in an argon-oxygen atmosphere. This was followed by a layer of 40 to 45 A silver and then approximately 5 A zinc deposited by sputtering the metal targets in an argon atmosphere. Next came another layer of 400 to 450 A of zinc oxide. This dielectric-metal-dielectric coating was provided with a protective overcoat by reactively sputtering the aluminum-silicon target in a sputtering gas comprising argon and oxygen at an argon:oxyen flow ratio of 20:1 at a total pressure of 6 mT (6×10$^{-3}$ Torr). The sputtering potential was 500V for the deposition of the aluminum-silicon oxide and the zinc oxide, 390V for silver and 800V for zinc. The refractive index of the aluminum-silicon oxide layer was 1.57.

The sample coatings of Tables 2 to 6 were made in a Model ILS-1600 sputtering system manufactured by Airco Solar Products, a division of the Assignee. This system has a load lock and a single coating chamber having three separate planar magnetron sputtering sources to which were mounted targets of zinc, silver and the aluminum-silicon alloy. All targets were 5 by 17 inches in size and the aluminum-silicon targets were approximately 0.25 inches thick. One target was approximately 72% aluminum with 28% silicon and incidental impurities and a second was approximately 88% aluminum with 12% silicon and incidental impurities. These targets were prepared as described above except that the 12% silicon target was cold-rolled before it was machined. The substrate to be coated was cleaned and placed on a horizontal conveyor system which transported the substrate through the system making one or more passes under the sputtering sources.

Typically, with this system, an 80 A layer of silver was deposited in one pass with a line speed of approximately 57 mm/sec, at a sputtering power of 0.5 kW and a potential of 300V, in an argon atmosphere at 4 mT. A 350 A layer of zinc oxide was deposited in one pass at a line speed of 15 mm/sec, at 3 kW and 390V, in an atmosphere containing argon and oxygen with a ratio of 1:15 and a total pressure of 3 mT. A 300 A layer of (88% Al, 12% Si) oxide was typically deposited in one pass with a line speed of approximately 5 mm/sec, at a power of 6.5 kW and potential of 280 to 300V, in an atmosphere of argon and oxygen with a ratio of 1:2 at a total pressure of 3 mT. A 300 A layer of (88% Al, 12% Si) nitride was typically deposited in one pass at 13 mm/sec, at 6.5 kW and 300 to 320V, in an atmosphere of argon and nitrogen with a ratio of 1:2 at a total pressure of 3 mT. A 300 A layer of (88% Al, 12% Si) oxynitride was typically deposited in one pass with a line speed of 9 mm/sec, at a power of 6 kW and potential of 320V, in an atmosphere of argon, nitrogen and oxygen with a ratio of 2:4:1 at a total pressure of 3 mT.

The normalized deposition rate D for each layer is calculated $$D = sdc/np$$

where

D is the normalized rate in A mm$^2$/J;
s is the speed of the moving substrate in mm/sec;
d is the thickness of the deposited layer in A;
c is the length of the closed-loop erosion region of the planar magnetron sputtering source in mm;
n is the number of times the substrate passes the sputtering source during the deposition; and
P is the sputter power in W.

The values of D for several oxides and nitrides are given in Table 1.

TABLE 1

| Compound | ZnO | SnO$_2$ | Al$_2$O$_3$ | TiO$_2$ | TiN | AlN |
|---|---|---|---|---|---|---|
| D | 1500 | 1000 | 200 | 100 | 380 | 650 |
| Compound | (88Al, 12Si)N$_x$ | | (72Al, 28Si)O$_x$ | | (88Al, 12Si)O$_x$ | |
| D | 500 | | 200 | | 150 | |

The sample coatings were subjected to five tests to determine their corrosion resistance and hardness and the numerical results of the five tests were added to obtain a composite durability index C whose range is 4 to 43.

Very briefly, the corrosion testing procedures were as follows:

DI24: The coating was placed in contact with a square of filter paper which had been saturated with de-ionized water. After 24 hours, the filter paper was removed, the sample blown dry and then photographed under a microscope at 100× and 400× magnification. The photographs were subjectively matched with a scale where 10 is not corroded and 1 is completely corroded.

NaCl24: The test procedure was the same as for DI24 except that the filter paper was saturated with a solution of 1% by wt sodium chloride in de-ionized water Fingerprint: Fingerprints were placed on sample coatings. After 24 hours, and again after 2 weeks, the coatings were cleaned with Kimwipes tissues and conventional glass cleaner. The samples were evaluated against a scale where 3 represented no corrosion, 2 a slight stain or other effect and 1 represented visible corrosion.

The hardness of the films was evaluated by two tests:

Eraser Tests: A coating was rubbed five times with a conventional pencil eraser and photographed under a microscope at 50× magnification. The photographs were matched to a scale where 10 represented no effect and 1 indicated that most of the film had been rubbed off. This test was performed twice for each sample.

Taber Abrader: Four by four inch sample coatings were abraded by 50 revolutions of CS-10F wheels with 500 g applied mass. The wheels were resurfaced for 25 revolutions after every 10 revolutions of abrasion. After 50 revolutions, the samples were photographed at 50× magnification and the number of scratches in a typical one by one inch square was determined. A score was computed as 10 - 9N/50 where N is the number of scratches. On this scale, zero scratches scores a 10, 50 scratches scores a one and greater than 50 scratches is assigned a score of 0.

The optical properties of the samples were determined with a spectrophotometer. $Y_F$ is the film side reflectance integrated over the visible spectrum as represented by the intensity parameter on the CIE chromaticity scale. $Y_G$ is a similar parameter for the glass side reflectance, and $Y_T$ is the visable transmittance of the sample. In some cases, the emissivity e and the sheet resistance $R_S$ (ohms/square) were measured.

The samples of Tables 2 and 3 include a dielectric-metal-dielectric coating. This coating is referred to as the ZnO Reference coating and has the nominal composition (350 A) ZnO+(80 A) Ag+(20 A)Zn+(520 A) ZnO. The durability and optical properties for a typical sample of this coating are given in the first row of Table 5 and Table 6.

Table 2 shows the composition of the aluminum-silicon alloy target, the reactive gas R, ratio r of $O_2$ flow to the total flow of $O_2$ and $N_2$, the overcoating thickness t, and the composite durability factor C for a group of coatings where a dielectric-metal-dielectric coating was overlayed with a protective coating deposited by reactively sputtering an aluminum-silicon alloy.

TABLE 2

Glass + D-M-D coating + $(Al,Si)R_x$ overlayer where D-M-D is the ZnO Reference coating

| Sample | % Si | R gas | Overlayer t(A) | C | r |
|---|---|---|---|---|---|
| 13-1 | 12 | $N_2$ | 300 | 34 | 0 |
| 12-1 | 12 | $O_2$ | 300 | 33 | 1 |
| 94-1 | 12 | $N_2$ | 300 | 37 | 0 |
| 113 | 12 | $O_2 + N_2$ | 300 | 39 | 0.3 |
| 72-2 | 28 | $O_2 + N_2$ | 300 | 34 | 0.2 |

Table 3 illustrates the aluminum-silicon composition, the reactive gas R, the layer thickness t, and composite durability factor C for a group of samples where a dielectric-metal-dielectric coating was provided with both an underlayer and an overlayer deposited by reactive sputtering of an aluminum-silicon alloy.

TABLE 3

Glass + $(Al,Si)R_x$ underlayer + D-M-D coating + $(Al,Si)R_x$ overlayer where D-M-D is the ZnO Reference coating

| | | Underlayer | | Overlayer | | |
|---|---|---|---|---|---|---|
| Sample | % Si | R gas | t(A) | R gas | t(A) | C |
| 14-2 | 12 | $N_2$ | 300 | $N_2$ | 300 | 35 |
| 15-2 | 12 | $O_2$ | 300 | $N_2$ | 450 | 37 |
| 12-3 | 12 | $O_2$ | 300 | $O_2$ | 300 | — |
| 26-1 | 28 | $O_2$ | 300 | $O_2$ | 300 | 34 |

Table 4 is similar to Table 3 but shows the parameters for a group of samples where a silver coating was provided with an underlayer and an overlayer of a reactively sputtered aluminum-silicon alloy.

TABLE 4

Glass + (Al,Si)R underlayer + Ag(80 A) coating + (Al,Si)R overlayer

| | | Underlayer | | | Overlayer | | |
|---|---|---|---|---|---|---|---|
| Sample | % Si | R gas | r | t(A) | R gas | r | t(A) | C |
| 53-1 | 28 | $N_2$ | 0 | 360 | $N_2$ | 0 | 550 | 24 |
| 68-1 | 28 | $O_2$ | 1 | 520 | $O_2$ | 1 | 750 | 20 |
| 73-1 | 28 | $O_2 + N_2$ | 0.2 | 253 | $O_2 + N_2$ | 0.2 | 370 | 23 |

Table 5 shows the results of the individual corrosion and hardness tests of a ZnO Reference coating (Sample 29-1) and a group of glass coatings made in accordance with the invention. The composition of the remaining samples in Table 5 is given in one of the Tables 2 to 4.

TABLE 5

Durability Test Data

| Sample | DI24 | NaCl24 | Fingerprint | Eraser | Taber | Composite |
|---|---|---|---|---|---|---|
| 29-1 | 6 | 6 | 1 | 6 | 6 | 25 |
| 13-1 | 7 | 7 | 3 | 9 | 8 | 34 |
| 12-1 | 9 | 9 | 3 | 6 | 6 | 33 |
| 94-1 | 10 | 8 | 3 | 8 | 8 | 37 |
| 113 | 10 | 10 | 3 | 7 | 9 | 39 |
| 72-2 | 9 | 6 | 2 | 9 | 8 | 34 |
| 14-2 | 9 | 8 | 3 | 8 | 7 | 35 |
| 15-2 | 9 | 7 | 2 | 10 | 9 | 37 |
| 12-3 | — | — | 3 | 7 | — | — |
| 26-1 | 8 | 7 | 3 | 9 | 8 | 34 |
| 53-1 | 9 | 4 | 3 | 8 | 0 | 24 |
| 68-1 | 4 | 6 | 2 | 8 | 0 | 20 |
| 73-1 | 4 | 3 | 3 | 8 | 5 | 23 |

Table 6 shows the optical properties of the ZnO Reference coating (Sample 29-1) and a group of sample coatings made according to the invention. The coating composition of each of the other samples of Table 6 is given in one of Tables 2 to 4. The emissivity of the ZnO Reference coating is 0.1. Experience indicates that a dielectric-metal-dielectric coating having a sheet resistance $R_s$ of 10 ohms per square or less will have an emissivity of 0.1 or less.

TABLE 6

| Sample | Optical Test Data | | | |
|---|---|---|---|---|
| | $Y_F$ | $Y_G$ | $Y_T$ | $R_s$ |
| 29-1 | 8 | 11 | 80 | 8 |
| 13-1 | 29 | 28 | 64 | 9 |
| 12-1 | 13 | 15 | 79 | 7 |
| 94-1 | 6 | 9 | 83 | 9 |
| 113 | 5 | 9 | 83 | 10 |
| 72-2 | 4 | 10 | 76 | — |
| 14-2 | — | — | — | 9 |
| 15-2 | — | — | — | 7 |
| 12-3 | — | — | 77 | 7 |
| 26-1 | 19 | — | 68 | — |
| 53-1 | 9 | 11 | 84 | 10 |
| 68-1 | 10 | 12 | 81 | — |

FIG. 1 shows the normalized deposition rate D as a function of the ratio r of oxygen to the total of oxygen and nitrogen for a group of coatings of (88% Al, 12% Si) oxynitride on glass. The argon:nitrogen ratio was constant at 1:2. The numbers indicated next to the data points are the atomic percentage of oxygen in the films as measured by electron spectroscopy for chemical analysis (ESCA).

Figure 2:
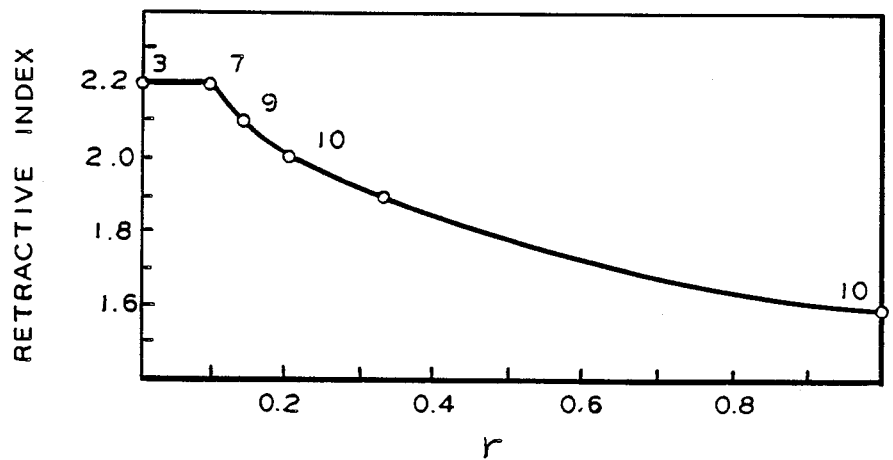
FIG. 2 is a graph showing the index of refraction as a function of ratio of $O_2$ flow to the total flow of $O_2$ and $N_2$ for coatings deposited by sputtering a target of 88% aluminum and 12% silicon in a mixture of argon, oxygen and nitrogen according to the invention.

FIG. 2 shows the index of refraction for a group of coatings similar to those of FIG. 1 except the argon:nitrogen ratio was 3:7.

The numbers indicated next to the data points in FIG. 2 are scores on a scale of 1 (peeling) to 10 (no noticable effect) based on exposure of 24 hours in a cabinet at 120° F. (49° C.) at a relative humidity of 95 to 100%. These data were for 300 A layers of (88% Al, 12% Si) oxynitride applied over a coating similar to the ZnO Reference cooling except that the second ZnO layer was only 220 A thick.

FIG. 1 indicates that the deposition rate drops rapidly as the oxygen flow ratio r increases up to about 0.3. FIG. 2 indicates that the index of refraction decreases for r greater than 0.1 but that the humidity resistance increases rapidly until r exceeds to about 0.2. The range for r from about 0.1 to 0.3 is preferred.

Figure 3:
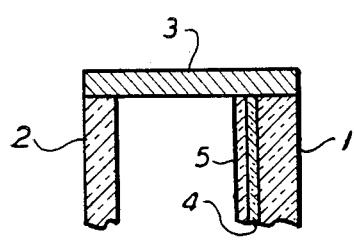
FIG. 3 is a view of a cross-section of a double-glazed window unit incorporating a transparent sheet coated according to the invention.

FIG. 3 shows a view of a cross-section of a double-glazed window unit. The unit comprises two transparent sheets 1 and 2 separated by a gap which is bridged by a conventional hermetic seal 3 around the aligned edges of the sheets. The sheets can be glass, plastic or other suitable material. Sheet 1 is the base for a coating 4, which may be a dielectric-metal-dielectric coating, and which is covered over by an amorphous coating 5 in accordance with the invention.

What is claimed is:

1. A method for depositing a coating and a protective overcoating on a substrate comprising:
   depositing a coating on the substrate;
   preparing a sputtering target of an alloy comprising aluminum and sufficient silicon to produce an amorphous overcoating;
   placing the target and the coated substrate in an evacuated chamber; and
   sputtering the target in an atmosphere comprising a gas having components which react with aluminum and silicon so as to form a transparent amorphous dielectric overcoating containing reaction products of aluminum and silicon.

2. The method according to claim 1, wherein the alloy comprises greater than about 6 percent and less than about 95% silicon.

3. The method according to claim 2, wherein the reactive gas is selected from the group consisting of oxygen nitrogen, compounds of oxygen, and compounds of nitrogen.

4. The method according to claim 3, wherein the substrate is transparent and the step of depositing a coating comprises depositing a dielectric-metal-dielectric coating by sputtering.

5. A method for depositing a transparent coating on a substrate comprising:
   preparing a sputtering target of an alloy comprising aluminum and 6 to 18 percent silicon;
   placing the target and the substrate in an evacuated chamber;
   sputtering the target in an atmosphere comprising a gas having components which react with aluminum and silicon so as to form an amorphous dielectric coating containing reaction products of aluminum and silicon.

6. The method according to claim 5, wherein the reactive gas is selected from the group consisting of nitrogen, oxygen, compounds of oxygen, and compounds of nitrogen.

7. The method according to claim 6, wherein the alloy comprises 82 to 90 percent aluminum and 10 to 14 percent silicon.

8. The method according to claim 7, wherein the alloy comprises approximately 88 percent aluminum and 12 percent silicon with incidental impurities.

9. The method according to claim 6, wherein the reactive gas comprises oxygen and nitrogen and the ratio of oxygen to the total of oxygen and nitrogen is in the range 0.1 to 0.3.

10. The method according to claim 9, wherein the alloy comprises 82 to 90 percent aluminum and 10 to 14 percent silicon.

11. The method according to claim 10, wherein the alloy comprises approximately 88 percent aluminum and 12 percent silicon with incidental impurities.

12. A coated article comprising a substrate, a coating on the substrate, and a protective overcoating on the coating where the overcoating comprises an amorphous dielectric layer of reaction products formed by sputtering a target in a reactive gas wherein the target is an alloy comprising aluminum and silicon.

13. A coated article according to claim 12, wherein the alloy comprises 6 to 95 percent silicon and the reactive gas is selected from the group consisting of oxygen, nitrogen, compounds of oxygen, and compounds of nitrogen.

14. A coated article according to claim 13, wherein the substrate is transparent, the coating comprises a multilayer dielectric-metal-dielectric coating, and the materials of the dielectric layers are selected from the group consisting of oxides of bismuth, indium, tin, titanium and zinc.

15. The coated article according to claim 13, wherein the coating is a dielectric-metal-zinc oxide.

16. The coated article according to claim 15, wherein the reactive gas contains oxygen and nitrogen and the ratio of oxygen to the total of oxygen and nitrogen is in the range 0.1 to 0.3.

17. The coated article according to claim 13, wherein the reactive gas contains oxygen and nitrogen and the ratio of oxygen to the total of oxygen and nitrogen is in the range 0.1 to 0.3.

18. The coated article according to claim 17, wherein the coating is a dielectric-silver coating.

19. A coated article comprising a substrate and an amorphous dielectric coating of reaction products formed by sputtering a target comprising an alloy of aluminum and 6 to 18 percent silicon in a reactive gas.

20. The article according to claim 19, wherein the reactive gas is selected from the group consisting of oxygen, nitrogen, compounds of oxygen, and compounds of nitrogen.

21. The coated article according to claim 20, wherein the reactive gas contains oxygen and nitrogen and the ratio of oxygen to the total of oxygen and nitrogen is in the range 0.1 to 0.3.

22. The coated article according to claim 21, wherein the substrate comprises a transparent base and a dielectric-metal coating over which the amorphous coating is deposited.

23. The article according to claim 21, wherein the substrate comprises a transparent base and a dielectric-metal-zinc oxide coating over which the amorphous coating is deposited.

24. The coated article according to claim 23, wherein the alloy contains approximately 88 percent aluminum and 12 percent silicon with incidental impurities.

25. The coated article of claim 24, further comprising a transparent sheet, and means for sealing the sheet and the base to form a double-glazed window unit with the amorphous coating inside.

* * * * *